United States Patent
Pan et al.

(10) Patent No.: US 7,618,870 B2
(45) Date of Patent: Nov. 17, 2009

(54) NON-UNIFORMLY DOPED HIGH VOLTAGE DRAIN-EXTENDED TRANSISTOR AND METHOD OF MANUFACTURE THEREOF

(75) Inventors: Shanjen Pan, Plano, TX (US); Sameer Pendharkar, Richardson, TX (US); James R. Todd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/357,653

(22) Filed: Jan. 22, 2009

(65) Prior Publication Data
US 2009/0124068 A1 May 14, 2009

Related U.S. Application Data

(62) Division of application No. 10/832,009, filed on Apr. 26, 2004, now Pat. No. 7,498,652.

(51) Int. Cl.
*H01L 21/336* (2006.01)
(52) U.S. Cl. .................. 438/306; 257/E29.197
(58) Field of Classification Search ......... 438/306–307, 438/140, 454; 257/355–356, 491–492, E29.197
See application file for complete search history.

(56) References Cited

U.S. PATENT DOCUMENTS

| | | | |
|---|---|---|---|
| 5,498,892 | A | 3/1996 | Walker et al. |
| 5,719,421 | A | 2/1998 | Hutter et al. |
| 6,111,291 | A | 8/2000 | Giebel |
| 6,140,683 | A | 10/2000 | Duvvury et al. |
| 6,153,916 | A | 11/2000 | Roth et al. |
| 6,424,005 | B1 | 7/2002 | Tsai et al. |
| 6,448,625 | B1 | 9/2002 | Hossain et al. |
| 6,492,679 | B1 | 12/2002 | Imam et al. |
| 6,504,184 | B2 | 1/2003 | Alok |
| 6,624,487 | B1 | 9/2003 | Kunz et al. |
| 6,670,685 | B2 | 12/2003 | Pendharkar |
| 6,770,951 | B2 | 8/2004 | Huang et al. |
| 6,887,772 | B2 | 5/2005 | Lee et al. |
| 6,909,143 | B2 | 6/2005 | Jeon et al. |

(Continued)

FOREIGN PATENT DOCUMENTS

EP      0267768 A      5/1988

(Continued)

*Primary Examiner*—Nathan W Ha
(74) *Attorney, Agent, or Firm*—Jacqueline J. Garner; Wade J. Brady, III; Frederick J. Telecky, Jr.

(57) ABSTRACT

The present invention provides, in one embodiment, a transistor (100). The transistor (100) comprises a doped semiconductor substrate (105) and a gate structure (110) over the semiconductor substrate (105), the gate structure (110) having a gate corner (125). The transistor (100) also includes a drain-extended well (115) surrounded by the doped semiconductor substrate (105). The drain-extended well (115) has an opposite dopant type as the doped semiconductor substrate (105). The drain-extended well (115) also has a low-doped region (145) between high-doped regions (150), wherein an edge of the low-doped region (155) is substantially coincident with a perimeter (140) defined by the gate corner (125). Other embodiments of the present invention include a method of manufacturing a transistor (200) and an integrated circuit (300).

6 Claims, 6 Drawing Sheets

U.S. PATENT DOCUMENTS

| | | |
|---|---|---|
| 6,911,694 B2 | 6/2005 | Negoro et al. |
| 6,930,005 B2 | 8/2005 | Efland et al. |
| 7,161,198 B2 | 1/2007 | Omi et al. |
| 7,576,391 B2 * | 8/2009 | Williams et al. ............. 257/335 |
| 2003/0127687 A1 * | 7/2003 | Kumagai et al. ............. 257/335 |
| 2003/0151088 A1 * | 8/2003 | Chen et al. .................. 257/328 |
| 2004/0108544 A1 | 6/2004 | Hossain et al. |
| 2004/0108549 A1 * | 6/2004 | Denison ..................... 257/335 |
| 2004/0113204 A1 | 6/2004 | Tsuchiko |
| 2004/0207012 A1 * | 10/2004 | Rumennik et al. .......... 257/343 |
| 2005/0184338 A1 * | 8/2005 | Huang et al. ................ 257/335 |
| 2006/0022265 A1 * | 2/2006 | Yoshida et al. .............. 257/335 |

FOREIGN PATENT DOCUMENTS

| | | |
|---|---|---|
| EP | 1191577 A1 | 3/2002 |

* cited by examiner

US 7,618,870 B2

NON-UNIFORMLY DOPED HIGH VOLTAGE DRAIN-EXTENDED TRANSISTOR AND METHOD OF MANUFACTURE THEREOF

This is a divisional application of Ser. No. 10/832,009 filed Apr. 26, 2004.

TECHNICAL FIELD OF THE INVENTION

The present invention is directed, in general, to a high voltage drain-extended transistor and a method of manufacturing thereof.

BACKGROUND OF THE INVENTION

There is a continuing push for transistor devices to perform at increasingly higher voltages. For instance, high-voltage transistors capable of serving as an interface between low-voltage transistors and high-voltage end-use devices, such as automotive components are in high demand. At the same time, however, it is crucial to not increase the manufacturing costs of high-voltage transistors. The use of existing process technologies minimize the cost and complexity of producing high voltage transistors and facilitates the production of high and low voltage transistors (e.g., operating voltage of less than about 5 Volts) in the same integrated circuit (IC).

A drain-extended transistor is one type of high voltage transistor design that can be manufactured without any additional processing steps. A drain-extended transistor, such as a drain-extend metal oxide semiconductor (DEMOS) transistor, incorporates a lightly to moderately doped region around one or both of heavily doped source and drain structures. The lightly to moderately doped region is known as a drain-extended well. Transistor fabrication processes to form a drain-extended well that require the use of an additional mask, dopant implantation and annealing steps are unacceptable.

Typically, the drain-extended well is of a same dopant type as the well of another transistor in a complementary MOS (CMOS) device in the IC. For instance, when the DEMOS transistor is an N-type Metal Oxide Semiconductor (NMOS) transistor, it may be associated with a P-type Metal Oxide Semiconductor (PMOS) transistor. Both the drain-extended well of the NMOS transistor and the well of the PMOS transistor are doped with the same dose of n-type dopant, at the same stage in the manufacturing process. A DEMOS transistor fabricated in this fashion can have breakdown voltages up to about 20-25 Volts. Despite their improved performance, however, drain-extended transistors are still susceptible to breakdown at high voltages.

Accordingly, what is needed in the art is a drain-extended transistor having reduced susceptibility to high voltage breakdown and a method of manufacturing the transistor without adding additional steps to existing processes.

SUMMARY OF THE INVENTION

To address the above-discussed deficiencies of the prior art, one aspect of the present invention provides a transistor. The transistor comprises a doped semiconductor substrate and a gate structure over the semiconductor substrate, the gate structure having a gate corner. The transistor also includes a drain-extended well surrounded by the doped semiconductor substrate. The drain-extended well has an opposite dopant type as the doped semiconductor substrate. The drain-extended well also has a low-doped region between high-doped regions, wherein an edge of the low-doped region is substantially coincident with a perimeter defined by the gate corner.

Another aspect of the present invention is a method of manufacturing a transistor. The method includes forming a doped semiconductor substrate and forming a drain-extended well within the doped semiconductor substrate. The drain-extended well has an opposite dopant type as the doped semiconductor substrate and the drain-extended well has a low-doped region between at least two high-doped regions. The method further comprises forming a gate structure over the doped semiconductor substrate, wherein an edge of the low-doped region is substantially coincident with a perimeter defined by a gate corner.

In another embodiment, the present invention provides an integrated circuit. The integrated circuit includes a high voltage transistor, having the above-described characteristics, and a low voltage transistor. The integrated circuit further comprises interconnect metal lines on one of more insulating layers located over the high and low voltage transistors and interconnecting the high and low voltage transistors to form an operative-integrated circuit.

The foregoing has outlined preferred and alternative features of the present invention so that those of ordinary skill in the art may better understand the detailed description of the invention that follows. Additional features of the invention are described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
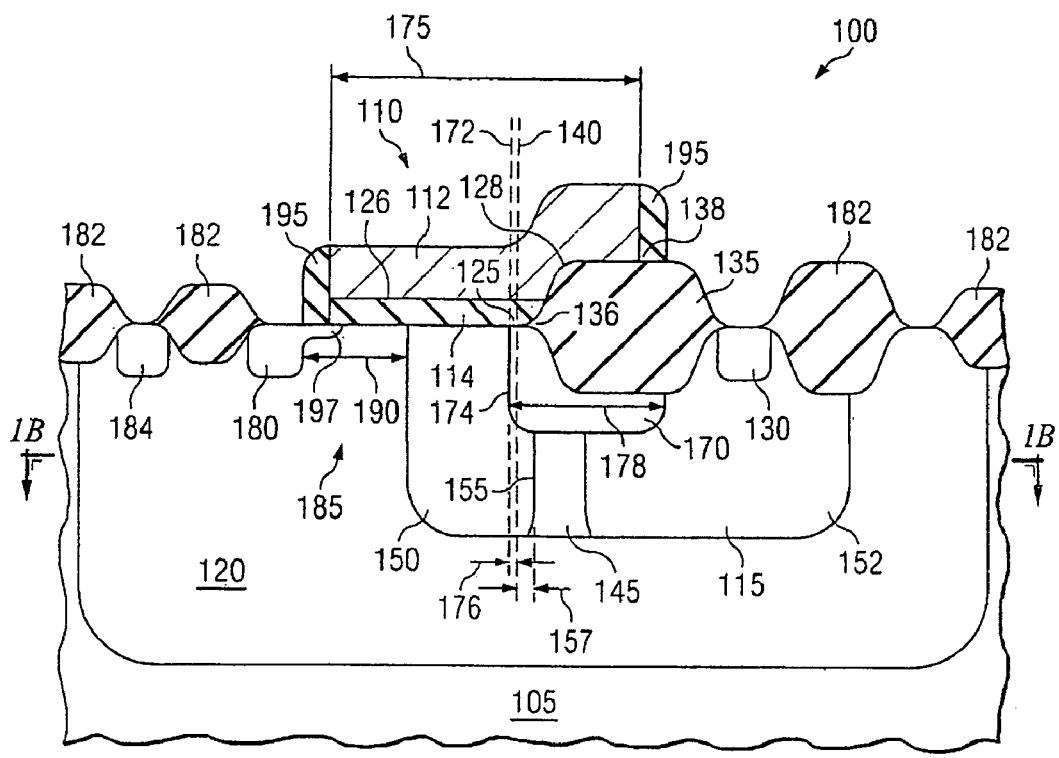
FIGS. 1A to 1B illustrate cross-sectional and plan views, respectively, of selected structures in an exemplary transistor of the present invention.

The present invention benefits from the realization that high-voltage breakdown is exacerbated by high dopant concentrations in the drain-extended well of conventionally made drain-extended transistors. As noted above, dopant implantations for the drain-extended wells of high-voltage transistors and the wells of an adjacent low-voltage transistors are typically done at the same processing step. Moreover, a relatively high dopant concentration is used to ensure that low voltage transistors are operative for a certain threshold voltage and channel length. Consequently, the dopant concentration in the drain-extended well is higher than desired to impart optimal high-voltage breakdown characteristics to the high-voltage transistor.

The present invention further recognizes that the critical or maximum field in the drain-extended well at breakdown often occurs in the vicinity of a gate corner that is proximate the drain where a high voltage is applied. The present invention advantageously reduces this critical field by providing a non-uniformly doped drain-extended well having a reduced dopant concentration near the gate corner. The resulting drain-extended transistor has a higher breakdown voltage than conventional drain extended transistors, which have a comparatively more uniform dopant concentration in the drain-extended well.

One aspect of the present invention is a transistor 100. As illustrated in a cross-sectional view through a portion of an exemplary transistor 100 in FIG. 1A, the transistor 100 comprises a doped semiconductor substrate 105 and a gate structure 110 over the semiconductor substrate 105. The gate structure 110 can include a gate electrode 112 and gate insulator 114. The transistor 100 also has a drain-extended well 115 having an opposite dopant type as the doped semiconductor substrate 105.

The semiconductor substrate 105 can be doped or an epitaxially grown p- or n-type doped layer, using conventional procedures. In some embodiments of the transistor 100, as well understood by those skilled in the art, it can be advantageous for the doped semiconductor substrate 105 to include a doped well 120. For example, when the transistor 100 is a PMOS transistor, it can be advantageous to include a p-type doped well 120. Alternatively, when the transistor 100 is an NMOS transistor, it may not be advantageous to have a p-type doped well 120 when the doped semiconductor substrate 105 already includes a p-type dopant.

The gate structure 110 has a corner 125 that is defined by the intersection of a gate structure edge 126 closest to substrate 105 and an adjoining gate structure edge 128 closest to a centered source/drain 130 in the drain-extended well 115, and to which a high voltage (e.g., greater than about 5 Volts) is applied. In some embodiments the transistor 100 is a non-linear transistor, with an isolation region 135 over the drain-extended well 115. The isolation region 135 can be a field oxide, formed via conventional local oxidation of silicon (LOCOS), or a shallow trench isolation (STI) processes well known to those skilled in the art. In some advantageous configurations, the isolation region 135 is between a portion of the gate structure 110 and the drain-extended well 115, such as shown in FIG. 1A. In such embodiments, the gate corner 125 is that part of the gate structure 110 nearest a bird's beak 136 of the isolation region 135. In other embodiments, however, where the transistor 100 is a linear transistor having no isolation region, the gate corner 125 will be an outer corner 138 of gate structure 110, proximate the centered source/drain 130.

While not limiting the present invention by theory, it is believed that when a high voltage is applied to the centered source/drain 130, strong electrical fields are generated in the vicinity of the gate corner 125. Consequently, physical signs of breakdown are often seen in the gate oxide 114 or drain-extended well 115 along or near a perimeter 140 defined by the gate corner 125. In the transistor 100 of the present invention, the drain-extended well 115 has a low-doped region 145 between high-doped regions, for example, first and second high-doped regions 150, 152. An edge 155 of the low-doped region 145 is substantially coincident with the perimeter 140 defined by the gate corner 125. It is believed that such a configuration is conducive to dissipating the electric field through a larger portion of the drain-extended well 115, and in particular, through the low-doped region 145. For example, notable improvements in the breakdown voltage of the transistor 100, compared to a conventional transistor with a uniformly doped drain-extended well, can be obtained when the distance 157 between the low-doped region edge 155 and the perimeter 140 is within about 2 microns. Even greater improvements in the breakdown voltage are obtained when the distance 157 is within about 1 micron. It is understood, however, that other distances and spatial relationships are within the scope of the present invention.

The term, low-doped region edge 155, as used herein, refers to a location in the transistor's structures where a concentration of dopant of the low-doped region 145 changes by the steepest amount per unit distance. One skilled in the art would understand that the edge 155 of the low-doped region 145 could be determined by measuring the dopant profile of the low-doped region 145 by conventional procedures, such as scanning capacitance microscopy (SCM) or secondary ion mass spectroscopy (SIMS) measurements. Analogous procedure could be performed to measure the dopant concentration profiles and edges for any of the transistor's structures.

Figure 1B:
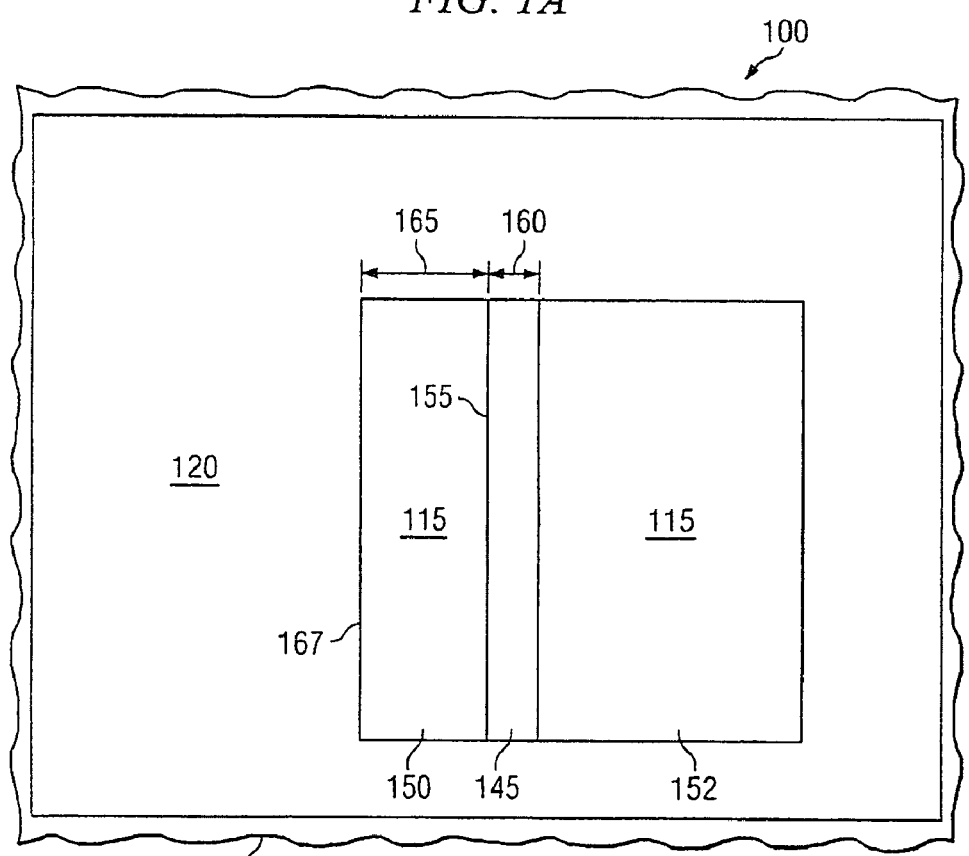

FIG. 1B shows a plan view of the transistor 100 through membranous section A-A of FIG. 1A. As illustrated in FIG. 1B, the drain-extended well 115 can have a rectangular shape. Other shapes, however, are also within the scope of the present invention. For instance, the drain extended well 115 can also have an annular or racetrack shape, such as that disclosed in U.S. Pat. No. 5,719,421 to Hutter et al. and U.S. patent application Ser. No. 10/746,978, to Edwards et al., both assigned to Texas Instruments Inc., and incorporated by reference herein in their entirety.

Continuing with FIG. 1B, the width 160 of the low-doped region 145 is one parameter governing the improvement in breakdown voltage obtained for embodiments of the transistor 100. In some instances, the low-doped region 145 has a width 160 of about 1 micron to about 2 microns. An improved breakdown voltage is also obtained when at least a portion of high-doped region 150 is under the gate structure 110 (FIG. 1A). In certain preferred embodiments, for example, a width 165 of a portion of the high-doped region 150 from the edge 167 of the drain extended well 115 to the edge 155 of the low-doped region 145 is about 1 micron to about 2 microns.

Returning now to FIG. 1A with continued reference to FIG. 1B, the relative dopant concentration in the low-doped region 140 is another parameter governing the extent of improvement in breakdown voltage in the transistor 100. Both the low-doped region 145 and high-doped regions 150, 152 are of the same dopant type as each other so that the entire drain-extended well 115 is electrically connected. The average concentration of majority carrier dopant in the high-doped regions 150, 152 are greater than the analogous concentration in the low-doped region 145. In certain advantageous embodiments, the ratio of dopant concentration in the high-doped regions 150, 152 to low-doped region 145 ranges from greater than about 1:1 to about 1000:1. In some preferred embodiments of the transistor 100, this ratio is between about 100:1 and about 1000:1.

The transistor 100 of the present invention has a higher breakdown voltage than an analogous transistor without a non-uniformly doped drain-extended well. For instance, in some advantageous embodiments, the transistor 100 has as a breakdown voltage of greater than about 25 Volts, and more preferably, greater than about 30 Volts. In addition, the transistor 100 of the present invention has a higher reliability than an analogous transistor without a non-uniformly doped drain-extended well. Reliability is defined as having no substantial degradation (e.g., less than about 1 percent) in a performance parameter of the transistor 100, such as on-state resistance, over a standardized accelerated lifetime operation. As an example, some embodiments of the transistor 100 operating at about 40 Volts have no substantial change in on-state resistance over an accelerated lifetime operation of 500 seconds, equivalent to a greater than about 10 years of normal device operation.

Some advantageous embodiments of the transistor 100 further include a floating ring 170. A floating ring is an implanted region within the semiconductor substrate 105 that is substantially free from an external electrical connection. The floating ring 170 comprises a complementary type of implant region to the type of implant used to form the drain-extended well 115. Any of the embodiments of the floating ring described in U.S. Pat. No. 6,670,685 to Pendharkar, assigned to Texas Instruments Inc., and incorporated by reference herein in its entirety, can be used in the transistor 100.

Preferably, the floating ring 170 is between the low-doped region 145 and the gate corner 125. Even more desirably, a perimeter 172 defined by the edge 174 of the floating ring 170 is under the gate structure 110. In certain preferred embodiments, for instance, floating ring 170 overlaps with about 20 percent of a gate width 175. In such embodiments, for example, the perimeter 172 of the floating ring edge 174 can be separated from the gate corner perimeter 140 by a distance 176 of about 0 to about 1 microns. In other preferred embodiments, the floating ring 170 has a width 178 that is between about 20 and 100 percent of the gate width 175.

Certain combinations of the floating ring 170 and the non-uniformly doped drain-extended well 115 work cooperatively to provide the transistor 100 with a higher voltage breakdown and reliability than attainable with either of these structures alone. For example, certain embodiments of the transistor 100 having both the floating ring 170 and the non-uniformly doped drain-extended well 115 have a voltage breakdown of greater than about 40 Volts, and in some cases, greater than about 56 Volts. Such transistors can also have an accelerated lifetime operation of at least about 500 seconds when operating at about 40 Volts.

The transistor 100 can also include a number of conventional device structures to provide an operative transistor device. Non-limiting examples of such structures include a second source/drain 180, isolation structures 182 and one or more backgates 182 in the doped semiconductor substrate 105 or doped well 120. The second source/drain 170 and the edge 167 the drain-extended well 115 form a channel region 185 there-between. In some embodiments, a channel length 190 typically ranges between about 0.5 microns and about 5 microns. Of course, one skilled in the art would understand that the channel length 190 will be selected based on the desired operating voltage of the device 100, and doping profiles for the transistor 100. In yet other embodiments of the transistor 100, sidewalls 195 are located adjacent to the gate structure 110, to facilitate the formation of one or more lightly doped drain regions 197 around one or both of the second source/drain 180 and centered source/drain 130.

In some configurations, the transistor 100 is a MOS transistor, such as PMOS or NMOS transistor. In other configurations, the transistor 100 is a bipolar transistor, with the centered source/drain 130, extended-drain well 115 and doped semiconductor substrate 105 or doped well 120, serving as emitter, base, and collector, respectively.

FIGS. 2A to 2H illustrate cross-sectional views of selected steps of another aspect of the present invention, a method of manufacturing a transistor 200. The method can be used to manufacturing any of the embodiments of the transistor 100 shown in FIG. 1 and discussed above. The same reference numbers are used in FIGS. 2A-2H to represent analogous structure to that shown in FIGS. 1A and 1B.

Figure 2A:
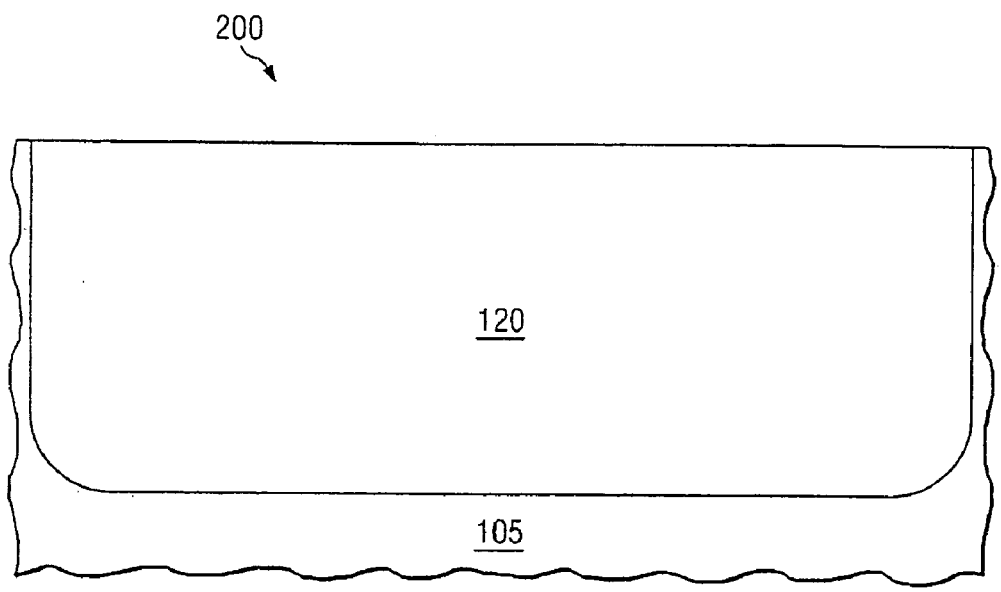
FIGS. 2A to 2H illustrate sectional views of selected steps in a method of making an exemplary transistor according to the principles of the present invention.

Turning first to FIG. 2A, illustrated is a cross-sectional view of the doped semiconductor substrate 105 after forming an optional doped well 120 therein. The doped semiconductor substrate 105 and the optional doped well 120 can be formed by conventional epitaxial growth, or dopant implantation and thermal diffusion, procedures well known to those skilled in the art. For instance, when the transistor 200 is to be an NMOS transistor, then the doped well 120 can be advantageously implanted with a P-type dopant, such as boron.

Figure 2B:
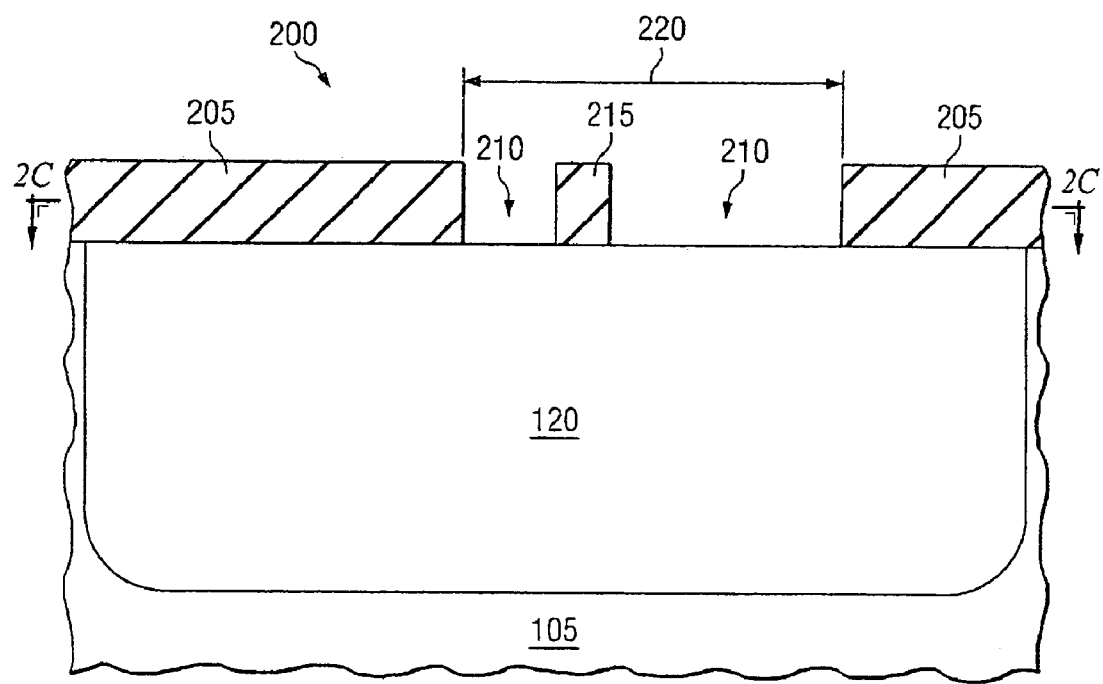

FIG. 2B shows the transistor 200 after forming a drain-extended well mask pattern 205 having openings 210. The mask pattern openings 210 define where the high-doped regions will be formed in the substrate 105, while an interior mask portion 215 defines where the low-doped region will be formed. The interior mask portion 215 is defined to be any portion of mask pattern 205 laying within an inner perimeter 220 of the mask pattern 205. In some protocols, a polysilicon layer is deposited and patterned to form the mask pattern 205. In other protocols, however, resist materials, such as photoresist, could be used to form the mask pattern 205.

Figure 2C:
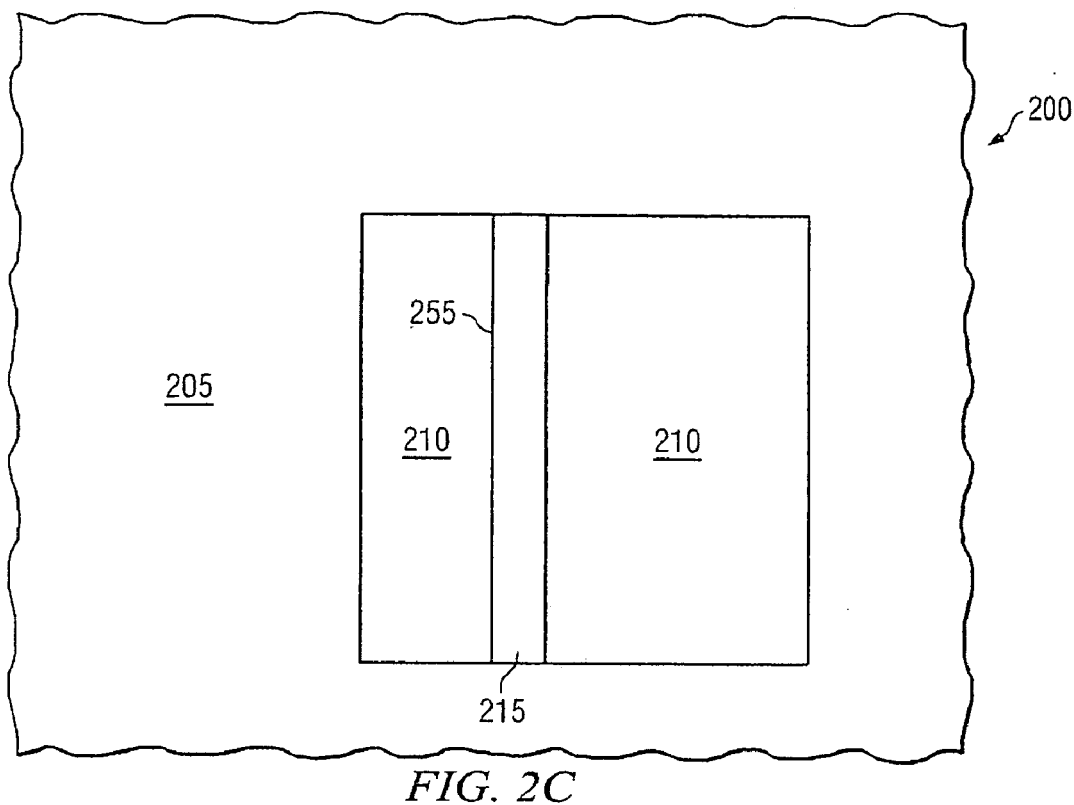
Figure 2D:
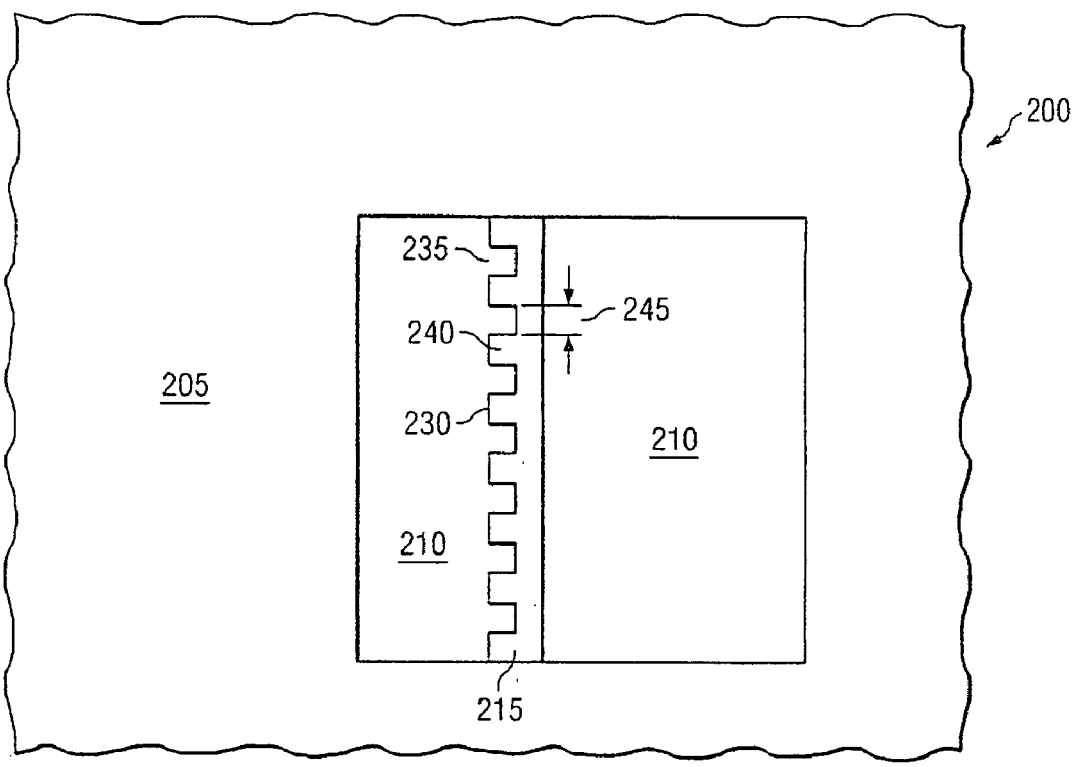

In some embodiments, such as shown in the plan view presented in FIG. 2C, the interior mask portion 215 has one or more straight mask edges 225. In alternative embodiments, such as illustrated in FIG. 2D, the interior mask portion 215 has one or more irregular edges 230. As further explained below, the use of an irregular mask edge 230 advantageously allows the concentration of dopant at the edge of the low-doped region to be adjusted to a finer resolution than the lithographic resolution for a given technology node. For instance, in some cases it is desirable for one or more spaces 235 between individual irregularities 240 to have a width 245 substantially equal to a minimum lithographic resolution.

Figure 2E:
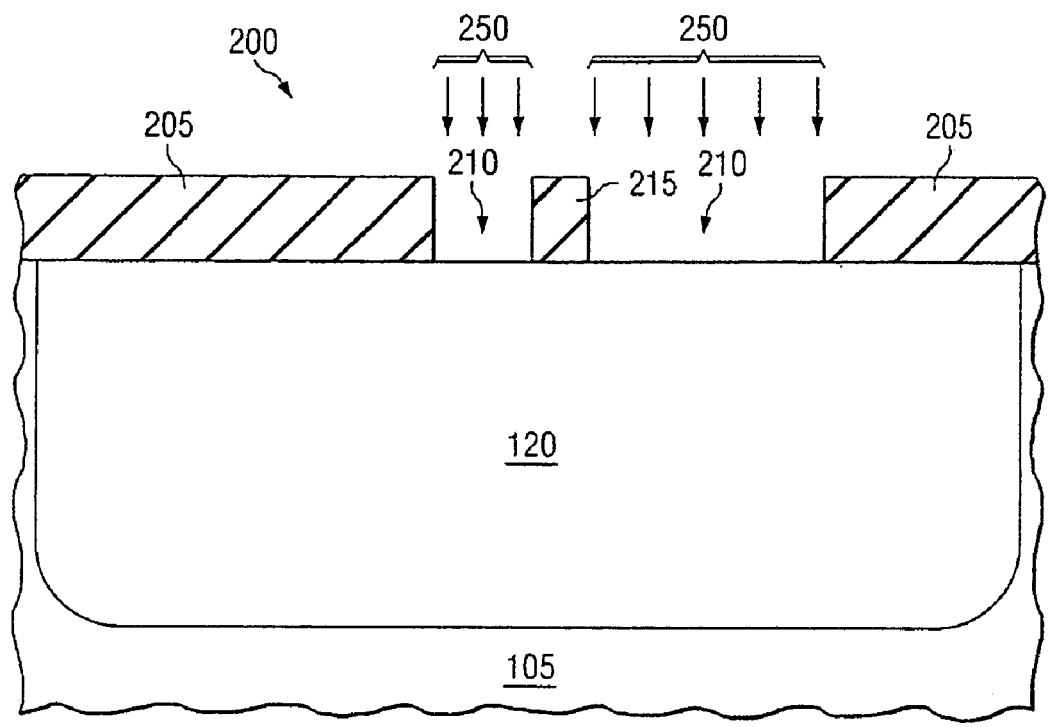

Turning now to FIG. 2E, illustrated is a cross-sectional view of the partially completed transistor 200 depicted in FIG. 2B during implantation of a dopant 250 of the drain-extended well through the openings 210 of the mask pattern 205. The dopant 250 is of an opposite dopant type as in the doped semiconductor substrate 105. For instance, continuing with the example where the transistor 200 is an NMOS transistor, the drain-extended well can be implanted with an N-type dopant such arsenic or phosphorus. One skilled in the art would understand that the dopants selected for implantation into the doped semiconductor substrate 105 or doped well 120 and subsequent thermal diffusion procedures to form the transistor 200 would depend upon the desired transistor configuration.

Figure 2F:
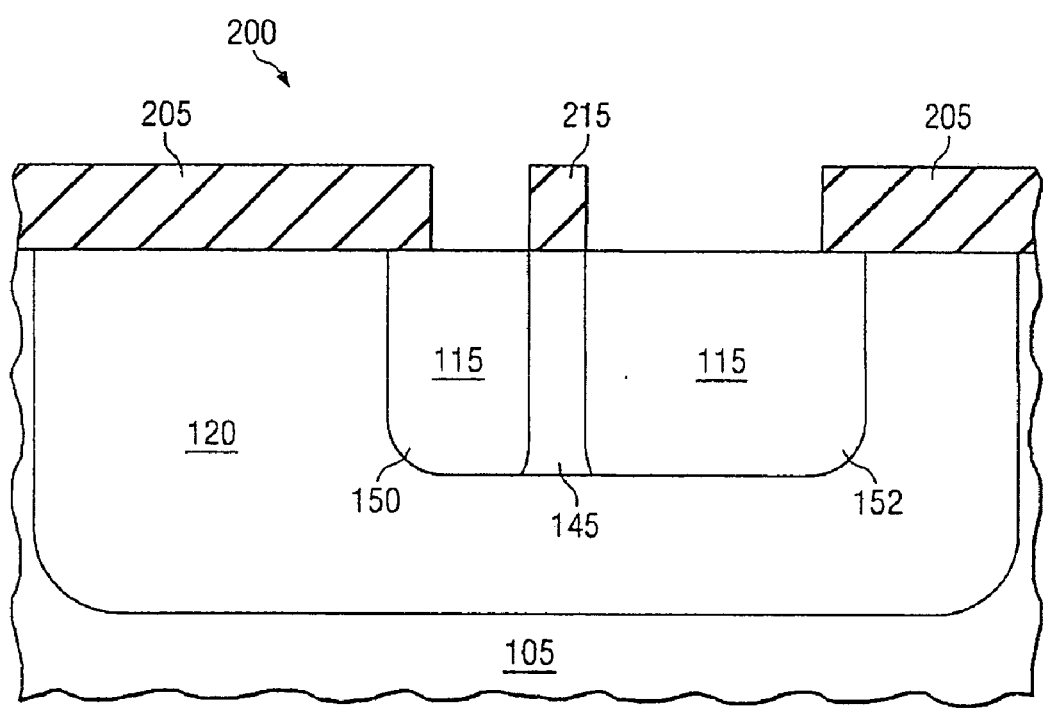

FIG. 2F, illustrates a cross-sectional view of the partially completed transistor after performing conventional thermal diffusion to form a drain-extended well 115 that is surrounded by the doped semiconductor substrate 105 or doped well 120. Thermal treatment causes a portion of the dopant to diffuse into the doped semiconductor substrate 105 or doped well 120 below the interior mask portion 215. Consequently, after thermal diffusion, the drain-extended well 115 has a low-doped region 145 between at least two high-doped regions 150, 152. For embodiments of the manufacturing processes using an irregular-edged mask pattern, such as shown in FIG. 2D, after dopant implantation and thermocycling, the dopant implanted through the spaces 235 diffuses into the substrate 105 below the individual irregularities 240. Returning to FIG. 2F, this provides a uniform dopant concentration at the edge of the low-doped region 155 that is intermediate between the dopant concentration in the high-doped region 145 and the dopant concentration in the interior 255 of the low-doped region 150.

Figure 2G:
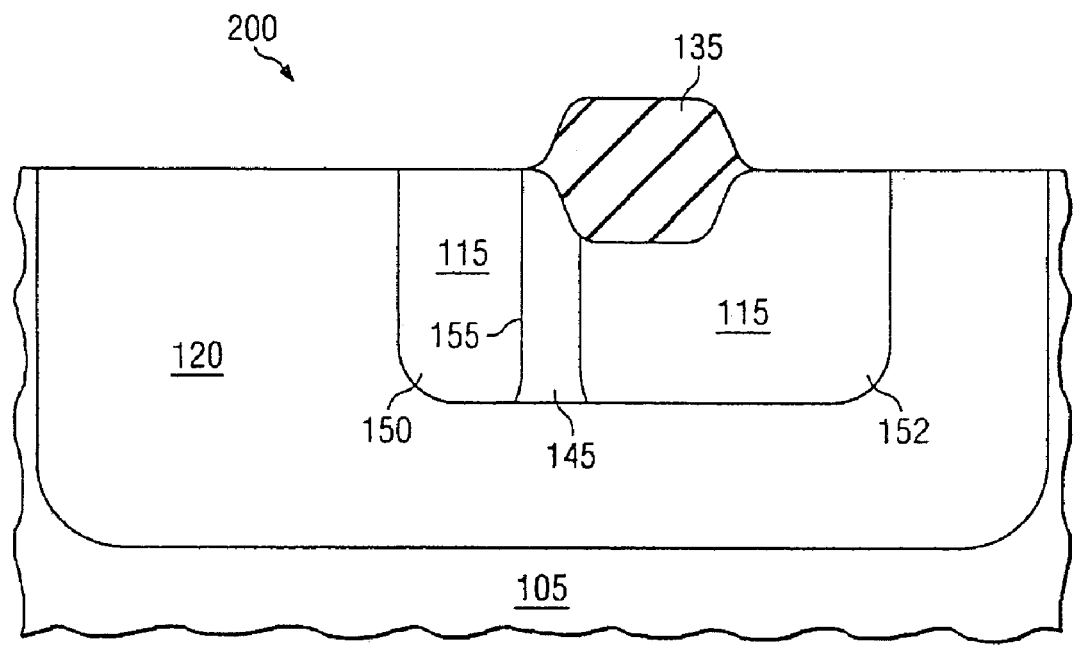

Turning now to FIG. 2G, illustrated is the partially completed transistor 200, after removing the mask pattern for the drain-extended well 115 and forming one or more isolation region 135. The isolation regions 135 can be formed by conventional LOCOS and STI procedures well known to those skilled in the art. In certain advantageous protocols, where it is desirable not to expose the isolation region 135 to the dopant of the drain-extended well 115, the isolation region 135 is formed after the thermal diffusion step to form the drain-extended well 115. Of course, in other protocols, process considerations may favor forming the isolation region 135 before forming the drain-extended well 115. Similarly, the isolation region 135 can be formed before or after forming conventional structures in the transistor 200.

Figure 2H:
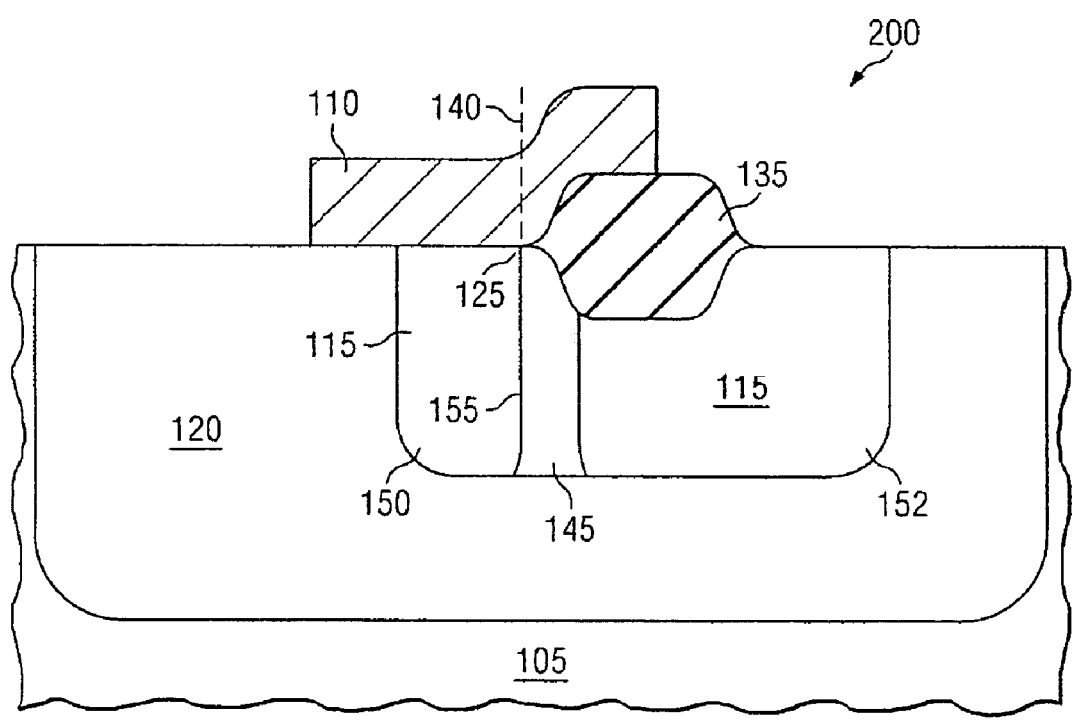

Turning now to FIG. 2H, shown is the partially completed transistor 200 after forming the gate structure 110 over the doped semiconductor substrate 105, wherein the edge 155 of the low-doped region 145 is substantially coincident with a perimeter 140 of the gate corner 125. Any conventional procedure could be used to form gates comprising an insulating layer made of silicon dioxide or similar material, and gate electrode made of polysilicon, metal or combinations thereof. In some advantageous embodiments, where the mask pattern 205 (shown in FIG. 2E) comprises polysilicon, a portion of the mask pattern 205 is retained to form the gate structure 110.

Of course, additional conventional processing steps can be conducted to form other device elements, including gate sidewalls, light doped drain regions, centered source/drain and second source/drain structures to yield a transistor 200 that is substantially similar to the transistor 100 depicted in FIG. 1A. Additionally, one skilled in the art would understand that the above process flow illustrates only one of many variations in the method to manufacture the transistor 200 within the scope of the present invention.

Figure 3:
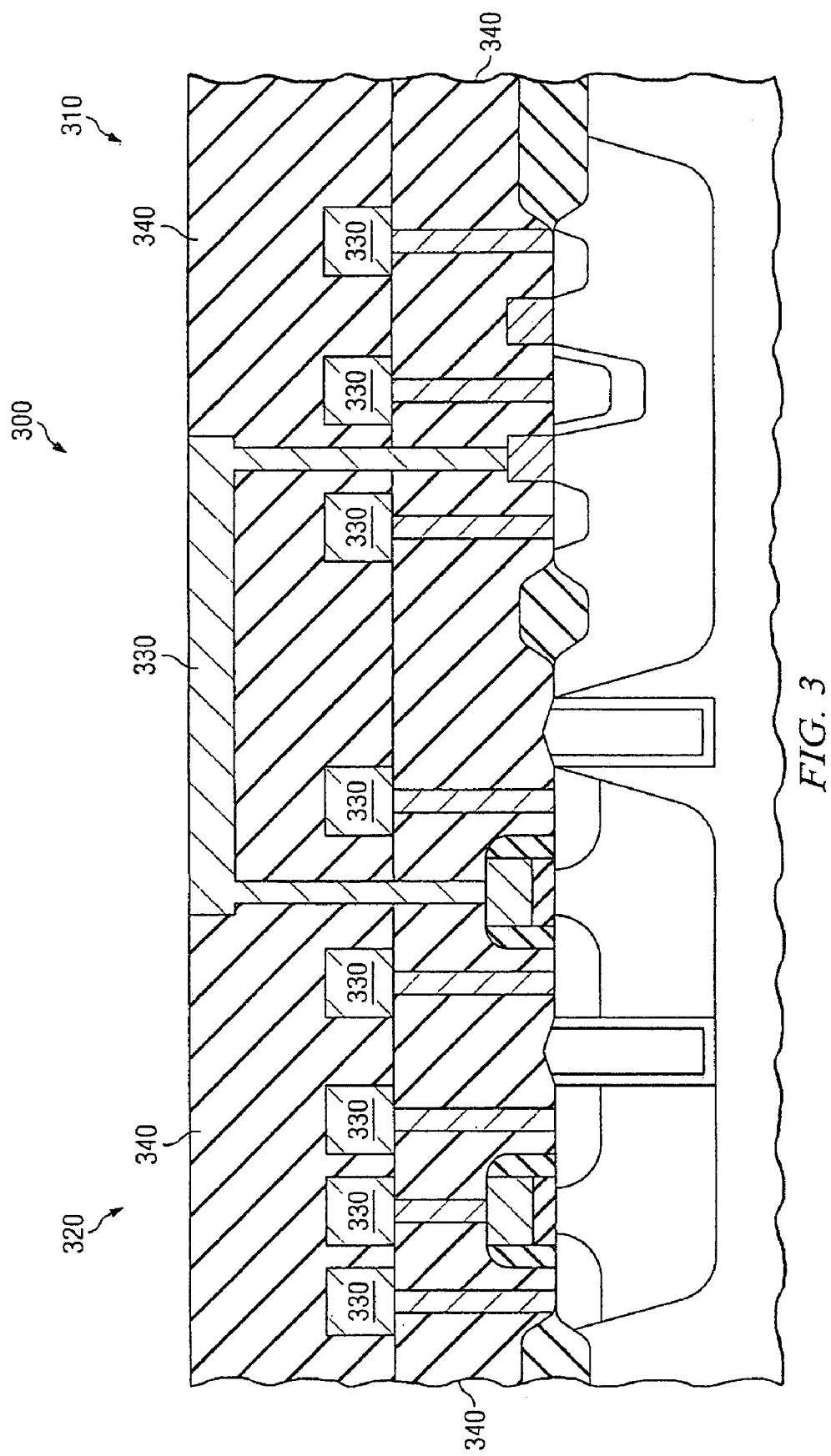
FIG. 3 illustrates a sectional view of selected components in a partially completed integrated circuit made according to the principles of the present invention.

Another aspect of the present invention is an integrated circuit 300 illustrated in FIG. 3. The integrated circuit includes a high voltage transistor 310. The high voltage transistor 310 can be substantially the same as any of the embodiments of the transistor illustrated in FIGS. 1A-1B as discussed above. Any of the methods for forming a transistor shown in FIGS. 2A-2H and discussed above can be used to form the transistor 310. In some embodiments, the high voltage transistor 310 includes a complementary MOS (CMOS) transistor and a bipolar transistor.

The integrated circuit 300 also includes a low voltage transistor 320. The low voltage transistor can be any conventional transistor device designed to operate in logic or memory circuits. Non-limiting examples include PMOS, NMOS, CMOS, and bipolar transistors. Preferably, the wherein the low voltage transistor 320 includes a doped semiconductor substrate 325 of the same dopant type as the drain-extended well 330 of the high voltage transistor 310.

The integrated circuit 300 further includes interconnect metal lines 340 on one of more insulating layers 350 located over the high and low voltage transistors 310, 320 and interconnecting the high and low voltage transistors 310, 320 to form an operative integrated circuit.

Although the present invention has been described in detail, one of ordinary skill in the art should understand that they can make various changes, substitutions and alterations herein without departing from the scope of the invention.

What is claimed is:

1. A method of manufacturing a transistor comprising:
   forming a doped semiconductor substrate;
   forming a drain-extended well within said doped semiconductor substrate, wherein said drain-extended well has an opposite dopant type as said doped semiconductor substrate and said drain-extended well has a low-doped region between at least two high-doped regions; and
   forming a gate structure over said doped semiconductor substrate, wherein an edge of said low-doped region is substantially coincident with a perimeter of a gate corner.

2. The method as recited in claim 1, wherein forming said drain-extended well includes forming a mask pattern for said drain-extended well wherein openings in said mask define said high-doped regions and an interior mask portion define said low-doped regions.

3. The method as recited in claim 2, wherein said interior mask portion has a straight edge.

4. The method as recited in claim 2, wherein said interior mask portion has a irregular edge.

5. The method as recited in claim 4, wherein spaces between irregularities of said irregular edge each have a width substantially equal to a minimum lithographic resolution.

6. The method as recited in claim 2, wherein forming said drain-extended well includes implanting dopant through said openings into said doped semiconductor substrate and diffusing a portion of said dopant into said doped semiconductor substrate below said interior mask portion.

* * * * *